(12) United States Patent
Katsunuma et al.

(10) Patent No.: US 9,939,499 B2
(45) Date of Patent: Apr. 10, 2018

(54) MAGNETIC RESONANCE IMAGING APPARATUS

(71) Applicant: TOSHIBA MEDICAL SYSTEMS CORPORATION, Otawara (JP)

(72) Inventors: Ayumi Katsunuma, Otawara (JP); Masatoshi Yamashita, Otawara (JP); Hiromitsu Takamori, Otawara (JP); Kota Watanabe, Otawara (JP); Hiroto Asai, Otawara (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 1308 days.

(21) Appl. No.: 13/939,864

(22) Filed: Jul. 11, 2013

(65) Prior Publication Data
US 2013/0314089 A1    Nov. 28, 2013

Related U.S. Application Data

(63) Continuation of application No. PCT/JP2012/050618, filed on Jan. 13, 2012.

(30) Foreign Application Priority Data

Jan. 13, 2011 (JP) .................. 2011-005074

(51) Int. Cl.
  *G01R 33/28*  (2006.01)
  *G01R 33/385*  (2006.01)
  *G01R 33/3873*  (2006.01)

(52) U.S. Cl.
  CPC ......... *G01R 33/28* (2013.01); *G01R 33/3854* (2013.01); *G01R 33/3858* (2013.01); *G01R 33/3873* (2013.01)

(58) Field of Classification Search
  CPC ............... G01R 33/28; G01R 33/3854; G01R 33/3858; G01R 33/3873
  See application file for complete search history.

(56) References Cited

U.S. PATENT DOCUMENTS

| 4,639,672 A | 1/1987 | Beaumont |
| 6,043,653 A | 3/2000 | Takamori et al. |
| (Continued) | | |

FOREIGN PATENT DOCUMENTS

| JP | 60-100954 | 6/1985 |
| JP | 1-194307 | 8/1989 |
| (Continued) | | |

OTHER PUBLICATIONS

Office Action dated Jan. 5, 2016 in JP Patent Application No. 2012-005446.
(Continued)

*Primary Examiner* — Dixomara Vargas
(74) *Attorney, Agent, or Firm* — Nixon & Vanderhye P.C.

(57) ABSTRACT

A magnetic resonance imaging apparatus according to an embodiment includes a static magnetic field magnet, a gradient coil, a bore tube and a sealed space forming unit. The gradient coil is formed to be approximately cylindrical, arranged in a cylinder of the static magnetic field magnet, and adds a gradient magnetic field to the static magnetic field. The bore tube is formed to be approximately cylindrical and arranged in the cylinder of the gradient coil. The sealed space forming unit forms a sealed space enclosing the gradient coil between an inner circumferential side of the static magnetic field magnet and an outer circumferential side of the bore tube. At least a part of at least one of the side ends of the gradient coil does not make contact with the sealed space.

9 Claims, 7 Drawing Sheets

(56) References Cited

U.S. PATENT DOCUMENTS

| | | | | |
|---|---|---|---|---|
| 6,404,200 B1 * | 6/2002 | Dietz | ............... | G01R 33/3854 324/307 |
| 6,437,568 B1 * | 8/2002 | Edelstein | ........... | G01R 33/3854 324/309 |
| 6,894,498 B2 * | 5/2005 | Edelstein | ........... | G01R 33/3854 324/318 |
| 6,954,068 B1 * | 10/2005 | Takamori | ........... | G01R 33/3854 324/318 |
| 7,026,816 B2 * | 4/2006 | Gebhardt | ............... | G01R 33/34 324/318 |
| 7,053,744 B2 * | 5/2006 | Arz | ................ | G01R 33/3854 324/318 |
| 7,068,033 B2 * | 6/2006 | Sellers | ............. | G01R 33/3854 324/307 |
| 7,135,863 B2 * | 11/2006 | Arik | ................ | G01R 33/3856 324/318 |
| 7,141,974 B2 * | 11/2006 | Edelstein | ........... | G01R 33/4215 324/318 |
| 7,375,526 B2 * | 5/2008 | Edelstein | ........... | G01R 33/3854 324/307 |
| 7,400,146 B2 * | 7/2008 | Ham | ................ | G01R 33/3854 324/307 |
| 7,489,131 B2 * | 2/2009 | Lvovsky | ............ | G01R 33/3856 324/300 |
| 7,523,538 B2 * | 4/2009 | Schuster | ............. | G01R 33/385 29/592.1 |
| 7,906,967 B2 * | 3/2011 | Katsunuma | ........ | G01R 33/3854 324/318 |
| 8,148,987 B2 * | 4/2012 | Kruip | ................ | G01R 33/3854 324/318 |
| 8,593,146 B2 * | 11/2013 | Gao | ................... | G01R 33/3856 324/318 |
| 8,624,598 B2 * | 1/2014 | Maciejewski | ...... | G01R 33/3854 324/318 |
| 8,710,842 B2 * | 4/2014 | Saha | ................ | G01R 33/3854 324/318 |
| 9,170,310 B2 * | 10/2015 | Ma | ................... | G01R 33/34023 |
| 2004/0061499 A1 | 4/2004 | Stocker | | |
| 2009/0079430 A1 | 3/2009 | Yamashita | | |
| 2010/0085053 A1 | 4/2010 | Iwasa et al. | | |

FOREIGN PATENT DOCUMENTS

| | | |
|---|---|---|
| JP | 10-118043 | 5/1998 |
| JP | 2001-104285 | 4/2001 |
| JP | 2003-70765 | 3/2003 |
| JP | 2009-090101 | 4/2009 |
| JP | 2010-5198 | 1/2010 |
| JP | 2010-104770 | 5/2010 |
| JP | 2011-78501 | 4/2011 |

OTHER PUBLICATIONS

International Search Report for PCT/JP2012/050618 dated Feb. 14, 2012.

A. Katsunuma et al., "Quiet MRI with Novel Acoustic Noise Reduction", Magnetic Resonance Materials in Physics, Biology and Medicine, vol. 13, 2002, pp. 139-144.

\* cited by examiner

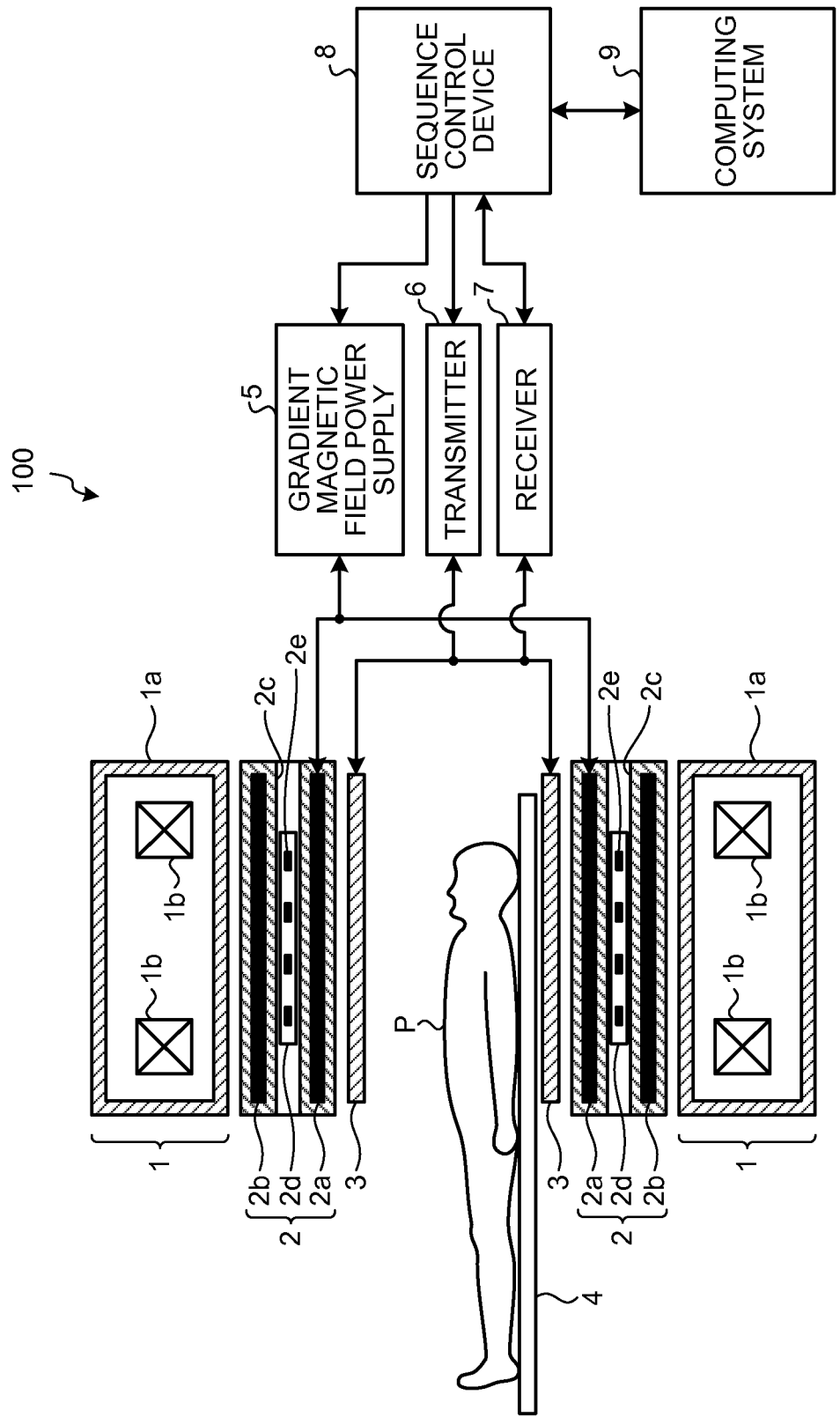

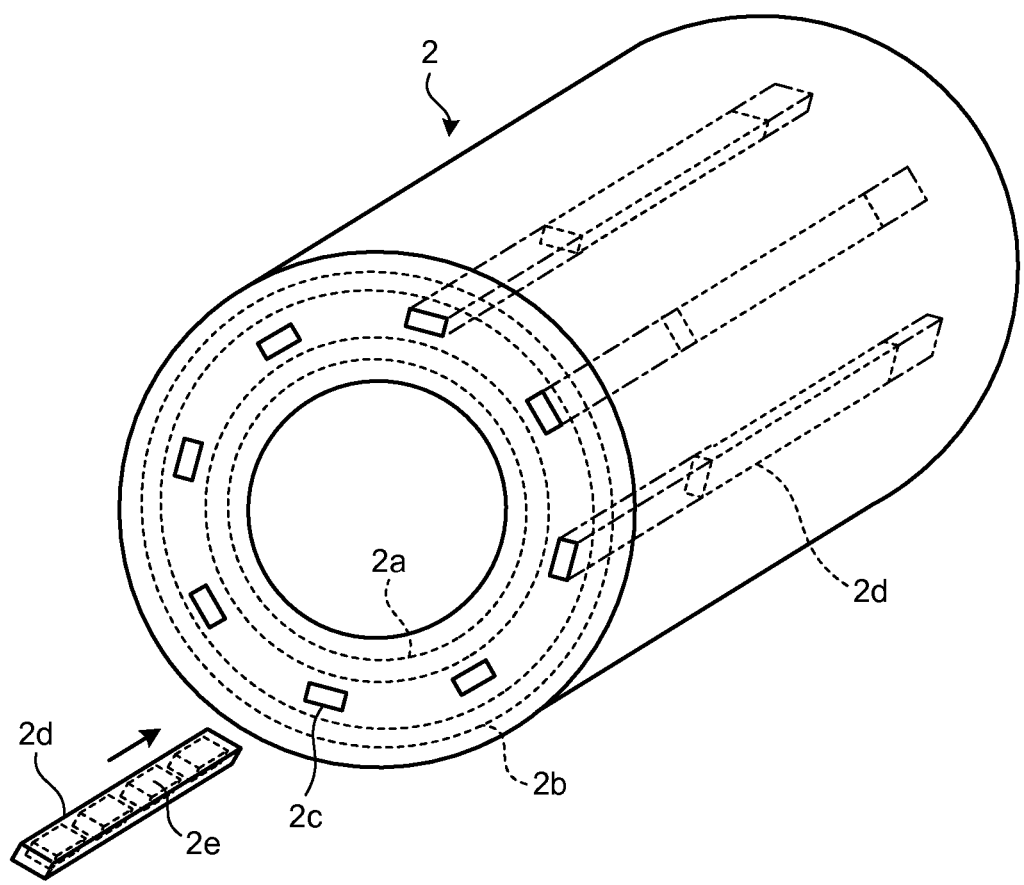

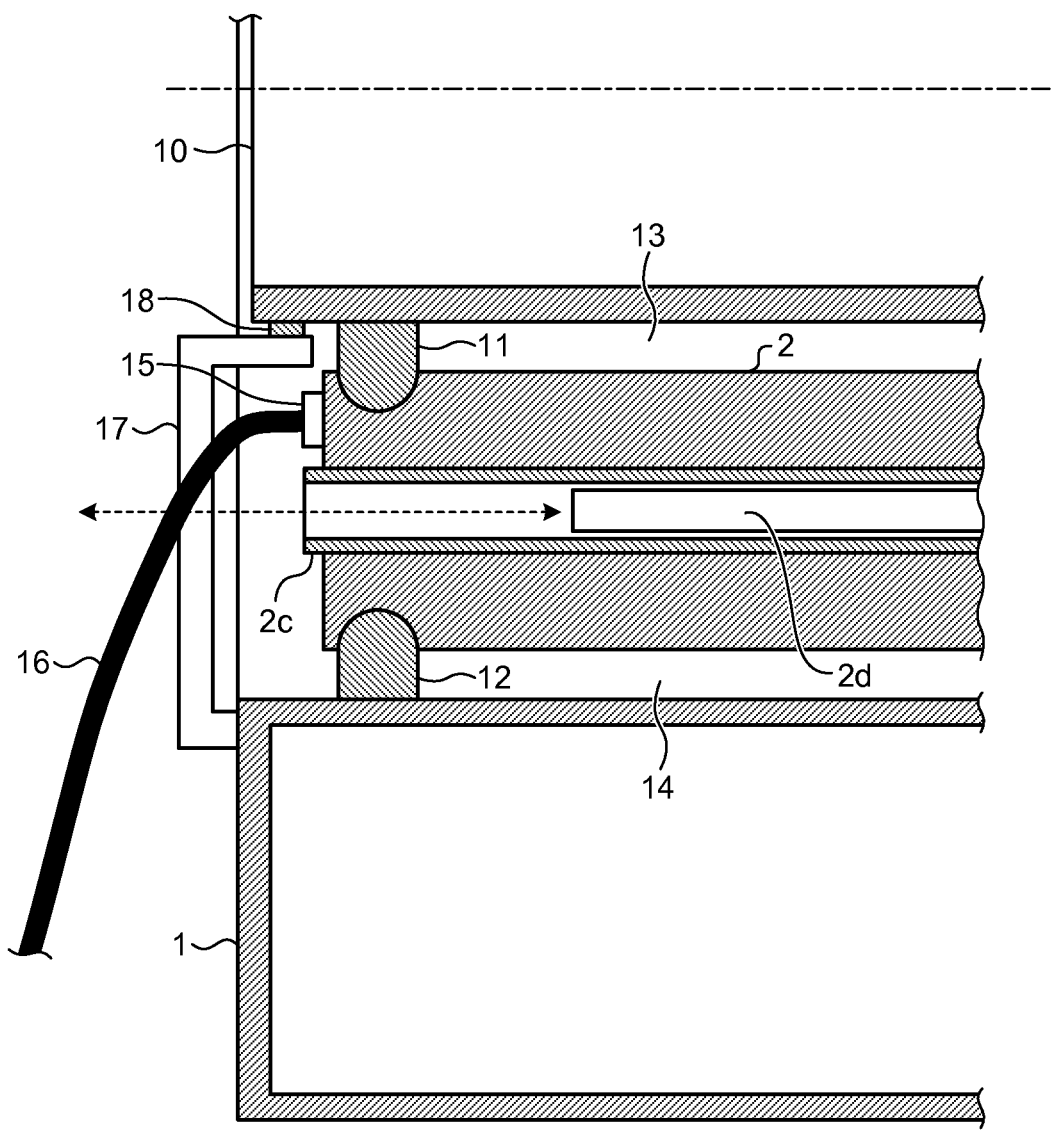

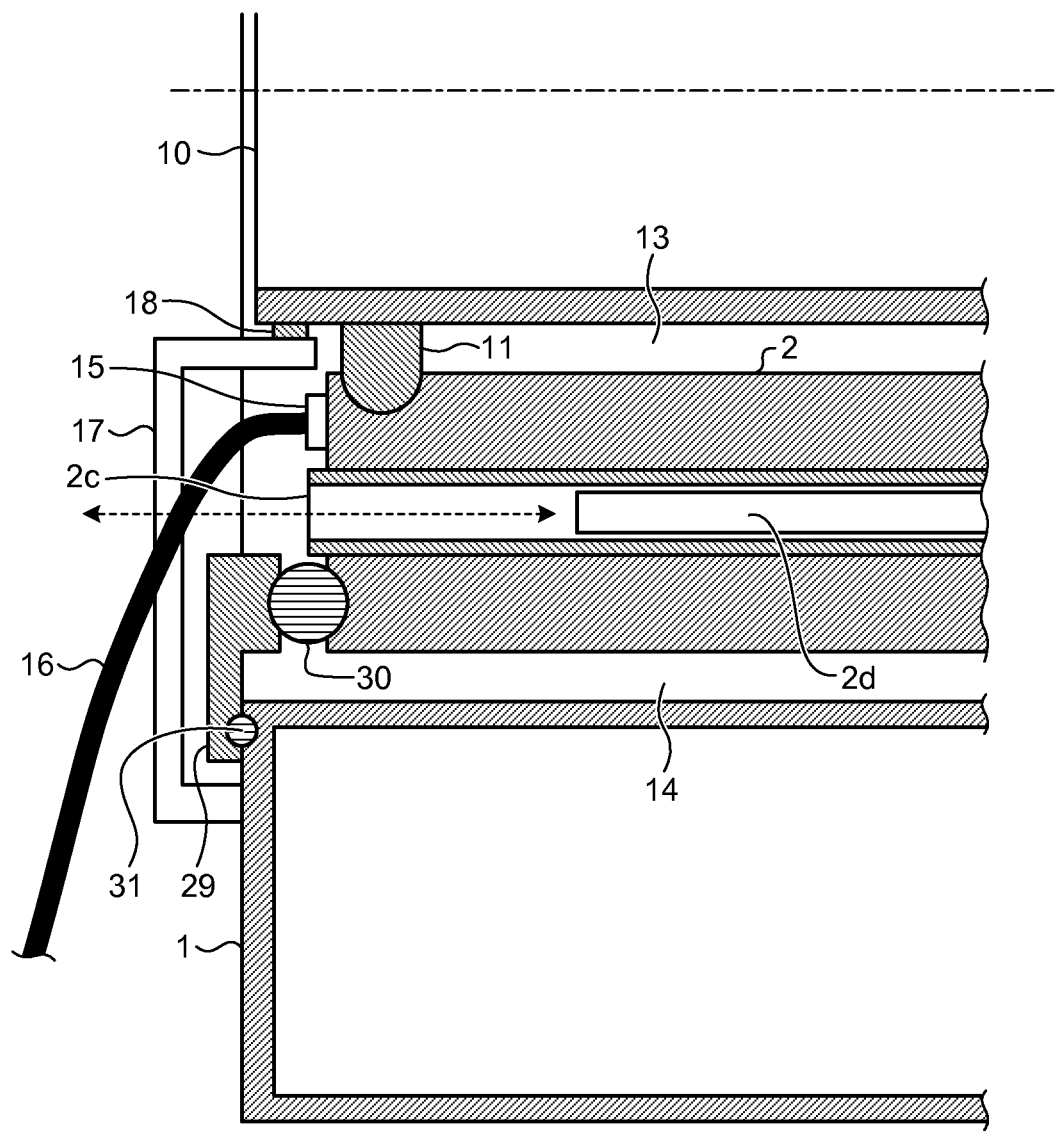

MAGNETIC RESONANCE IMAGING APPARATUS

CROSS-REFERENCE TO RELATED APPLICATIONS

This application is a continuation of PCT international application Ser. No. PCT/JP2012/050618 filed on Jan. 13, 2012 which designates the United States, and which claims the benefit of priority from Japanese Patent Application No. 2011-005074, filed on Jan. 13, 2011; the entire contents of which are incorporated herein by reference.

FIELD

Embodiments described herein relate to a magnetic resonance imaging apparatus.

BACKGROUND

For conventional magnetic resonance imaging apparatuses, noise-reduction technologies are known that reduce noise due to the vibration of a gradient coil by arranging a gradient coil completely within a vacuum. In such noise reduction technologies, for example, a sealing cover is fixed to a side end of each of a static magnetic field magnet, which is formed to be cylindrical, and a bore tube, so that a sealed housing is formed around the gradient coil arranged between the static magnetic field magnet and the bore tube. By discharging the air in the sealed space with a vacuum pump, a vacuum is formed around the gradient coil.

The gradient coil, however, may be provided with an electrode unit to which a cable for supplying current to the gradient coil is connected and with a shim tray storing an iron shim that corrects non-uniformity of the static magnetic field. In order to carry out maintenance of such parts, work is done after the inside of the sealed housing is brought back to the atmospheric state by detaching a vacuum sealing cover and then the sealing cover must be re-attached, which is quite time-consuming. For this reason, the conventional technologies may reduce the maintainability of the gradient coil.

BRIEF DESCRIPTION OF THE DRAWINGS

FIG. 1 is a diagram of an overall configuration of a magnetic resonance imaging apparatus according to a first embodiment;

FIG. 2 is a perspective view of a structure of a gradient coil according to the first embodiment;

FIGS. 3A and 3B are cross-sectional views of a structure of the static magnetic field magnet and the gradient coil in the vicinity of their side ends according to the first embodiment;

FIG. 7 is a cross-sectional view of a structure of a static magnetic field magnet and a gradient coil in the vicinity of their side ends according to a third embodiment.

DETAILED DESCRIPTION

Figure 3B:
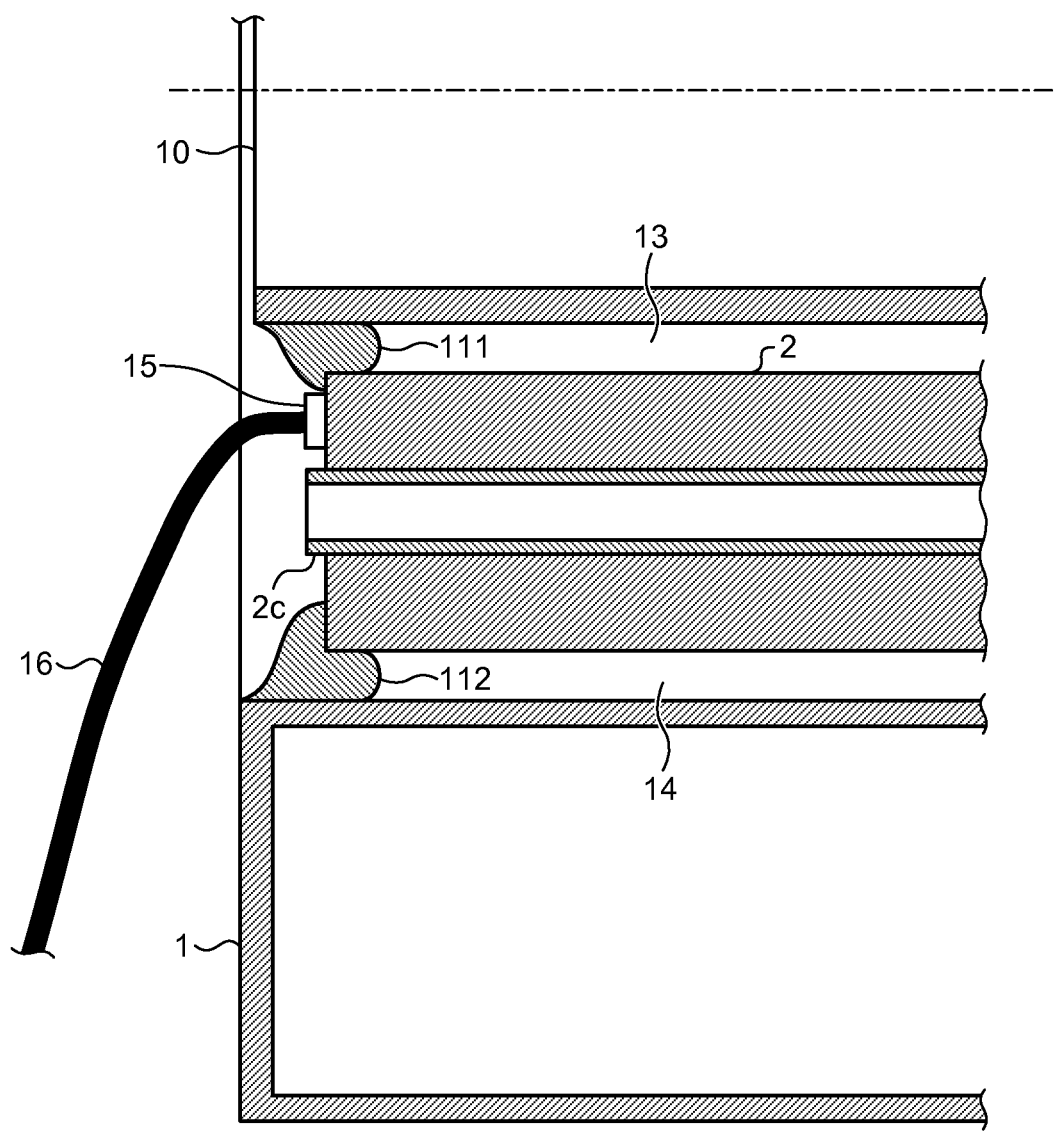

A magnetic resonance imaging apparatus according to an embodiment includes a static magnetic field magnet, a gradient coil, a bore tube and a sealed space forming unit. The static magnetic field magnet is formed to be approximately cylindrical and generates a static magnetic field in a space in the cylinder. The gradient coil is formed to be approximately cylindrical, arranged in the cylinder of the static magnetic field magnet, and adds a gradient magnetic field to the magnetic field. The bore tube is formed to be approximately cylindrical and arranged in the cylinder of the gradient coil. The sealed space forming unit forms a sealed space enclosing the gradient coil between an inner circumferential side of the static magnetic field magnet and an outer circumferential side of the bore tube. At least a part of at least one of the side ends of the gradient coil does not make contact with the sealed space.

(First Embodiment)

An overall configuration of a magnetic resonance imaging apparatus according to a first embodiment will be described here. FIG. 1 is a diagram of the overall configuration of a magnetic resonance imaging apparatus 100 according to the first embodiment. The magnetic resonance imaging apparatus is referred to as an MRI (magnetic resonance imaging) apparatus below.

As shown in FIG. 1, the MRI apparatus 100 includes a static magnetic field magnet 1, a gradient coil 2, an RF coil 3, a couchtop 4, a gradient magnetic field power supply 5, a transmitter 6, a receiver 7, a sequence control device 8, and a computing system 9.

The static magnetic field magnet 1 is formed to be approximately cylindrical and generates a static magnetic field in the space in the cylinder. For example, the static magnetic field magnet 1 includes an approximately cylindrical vacuum housing 1a and a superconducting coil 1b that is soaked in a coolant in the vacuum housing 1a, and the static magnetic field magnet 1 generates a static magnetic field in a bore (the space in the cylinder of the static magnetic field magnet 1) that is an imaging area.

The gradient coil 2 is formed to be approximately cylindrical, is arranged in the cylinder of the static magnetic field magnet 1, and adds a gradient magnetic field to the static magnetic field. For example, the gradient coil 2 is an ASGC (active shield gradient coil) including a main coil 2a and a shield coil 2b. The main coil 2a applies gradient magnetic fields in the directions of an X-axis, a Y-axis, and a Z-axis by using currents supplied from the gradient magnetic field power supply 5. The shield coil 2b generates a magnetic field that cancels out any leaked magnetic field from the main coil 2a.

Shim tray insertion guides 2c are formed between the main coil 2a and the shield coil 2b. Shim trays 2d each housing iron shims 2e that correct magnetic field non-uniformity are inserted into the shim tray insertion guides 2c. The overall configuration of the gradient coil 2 is described in detail below.

The RF coil 3 is fixed to the inner side of the gradient coil 2 so as to be on opposite sides of a patient P. The RF coil 3 applies RF pulses transmitted from the transmitter 6 to the patient P and receives magnetic resonance signals that are emitted from the patient P because of the excitation of hydrogen nuclei.

The couchtop 4 is provided on a couch (not shown) such that it can move horizontally and, when imaging is performed, the patient P is set on the couchtop 4 and the couchtop 4 is moved into the bore. The gradient magnetic field power supply 5 supplies a current to the gradient coil 2 according to an instruction from the sequence control device 8.

According to the instruction from the sequence control device 8, the transmitter 6 transmits an RF pulse to the RF coil 3. The receiver 7 detects a magnetic resonance signal received by the RF coil 3 and transmits raw data, which is obtained by digitizing the detected magnetic resonance signal, to the sequence control device 8.

The sequence control device 8 scans the patient P by driving the gradient magnetic field power supply 5, the transmitter 6, and the receiver 7 under the control of the computing system 9. When, as a result of scanning, raw data is transmitted from the receiver 7, the sequence control device 8 transmits the raw data to the computing system 9.

The computing system 9 controls the whole MRI apparatus 100. Specifically, the computing system 9 includes an input unit that receives various inputs from an operator; a sequence controller that causes the sequence control device 8 to perform scanning according to imaging conditions input by an operator; an image reconstruction unit that reconstructs an image on the basis of the raw data transmitted from the sequence control device 8; a storage unit that stores the reconstructed images etc.; a display unit that displays various types of information, such as the reconstructed image; and a main controller that controls operations of each functional unit according to instructions from the operator.

The overall structure of the gradient coil 2 will be described below. FIG. 2 is a perspective view of the structure of the gradient coil 2 according to the first embodiment. As depicted in FIG. 2, the gradient coil 2 includes the approximately cylindrical main coil 2a and the shield coil 2b. The main coil 2a generates gradient magnetic fields in the directions of the X-axis, the Y-axis, and the Z-axis by using currents supplied from the gradient magnetic field power supply 5. The shield coil 2b generates a magnetic field that cancels out any leaked magnetic field from the main coil 2a.

Multiple shim tray insertion guides 2c are formed between the main coil 2a and the shield coil 2b. The shim tray insertion guides 2c are holes forming openings on one edge surface or both edge surfaces of the gradient coil 2 and are formed along the whole length of the gradient coil 2 in the longitudinal direction. The shim tray insertion guides 2c are formed in parallel at equal intervals in the circumferential direction in an area between the main coil 2a and the shield coil 2b. The shim tray insertion guides 2c are formed by burying square-pipe-shaped members, which are made in accordance with the size of the shim trays 2d, in the gradient coil 2.

The shim trays 2d are inserted into the shim tray insertion guides 2c. The shim trays 2d are made of a resin that is a non-magnetic, non-conductive material and are approximately rod-shaped. The shim tray 2d houses a given number of iron shims 2e. The shim trays 2d are inserted into the shim tray insertion guides 2c and fixed so as to be positioned at the center of the gradient coil 2.

The structure of the side ends of the static magnetic field magnet 1 and the gradient coil 2 will be described here. FIGS. 3A and 3B are cross-sectional views of the structure of the static magnetic field magnet 1 and the gradient coil 2 in the vicinity of their side ends according to the first embodiment. FIG. 3A depicts a cross-section of a part lower than the center of the static magnetic field, depicts a cross-section of the gradient coil 2 in a position where the shim tray insertion guide 2c is located, and illustrates the outer frame of the static magnetic field magnet 1. Furthermore, FIG. 3A depicts only one of the side ends of each of the static magnetic field magnet 1 and the gradient coil 2, and the other side end have structure that mirrors the structure depicted in FIG. 3A. The gradient coil 2 is supported by, for example, a support structure (not shown) provided on the inner circumference of the static magnetic field magnet 1 such that the gradient coil 2 is held at a position distant from the inner circumference of the static magnetic field magnet 1.

As depicted in FIG. 3A, a bore tube 10, which is not shown in FIG. 1, is arranged in the cylinder of the gradient coil 2. The bore tube 10 is formed to be approximately cylindrical and thus forms a space in the cylinder in which the patient is set. The bore tube 10 prevents the patient set in the cylinder from making contact with the gradient coil 2.

In the vicinity of the side ends of the static magnetic field magnet 1 and the gradient coil 2, a sealed space that encloses the gradient coil 2 is formed between the inner circumference of the static magnetic field magnet 1 and the outer circumferential side of the bore tube 10 and a sealed space forming unit that positions at least a part of at least one of the side ends of the gradient coil 2 at the outside of the sealed space. Accordingly, at least a part of at least one of the side ends of the gradient coil 2 does not make contact with the sealed space, which is formed by the sealed space forming unit. The sealed space formed by the sealed space forming unit is kept in a vacuum state by using a vacuum pump (not shown). The vacuum state includes a low-pressure state that is close to a vacuum state.

For example, as shown in FIG. 3A, the sealed space forming unit includes a first sealing member 11 and a second sealing member 12. The first sealing member 11 is arranged in a gap between the outer circumference of the bore tube 10 and the inner circumference of the gradient coil 2 and seals the gap. The second sealing member 12 is arranged in a gap between the inner circumference of the static magnetic field magnet 1 and the outer circumference of the gradient coil 2 and seals the gap. The first sealing member 11 and the second sealing member 12 are, for example, rubber seals (also referred to as packing) that are formed in a ring shape.

As described above, by arranging the first sealing member 11 that seals the gap between the outer circumference of the bore tube 10 and the inner circumference of the gradient coil 2 in the vicinity of the side end of the gradient coil 2, a sealed space 13 is formed between the outer circumference of the bore tube 10 and the inner circumference of the gradient coil 2. By arranging the second sealing member 12 that seals the gap between the inner circumference of the static magnetic field magnet 1 and the outer circumference of the gradient coil 2 in the vicinity of the side end of the gradient coil 2, a sealed space 14 is formed between the inner circumference of the static magnetic field magnet 1 and the outer circumference of the gradient coil 2.

In addition, the side end of the gradient coil 2 is positioned outside of the sealed spaces 13 and 14 with the first sealing member 11 and the second sealing member 12 serving as borders. Accordingly, the side end of the gradient coil 2 is exposed to the atmosphere. Because the side end of the gradient coil 2 is smaller in area than the outer circumferential part and the inner circumferential part of the gradient coil 2, acoustic emissions from the side end are low. Accordingly, an increase in noise due to exposure of the side end of the gradient coil 2 to the atmosphere is low.

As depicted in FIG. 3A, at the side end of the gradient coil 2 positioned outside the sealed spaces 13 and 14, the shim tray insertion guides 2c form openings into which the shim trays 2d are inserted. In general, when static magnetic field uniformity is adjusted, shim trays are taken out of a gradient coil and the number of iron shims in a shim tray is increased or decreased. In the present embodiment, because the openings into which the shim trays 2d are inserted are exposed to the outside of the sealed space, the shim trays 2d can be inserted and taken out easily. Accordingly, the number of operations to adjust the magnetic field uniformity can be reduced.

As depicted in FIG. 3A, an electrode unit 15 is provided at the side end of the gradient coil 2 positioned outside the sealed spaces 13 and 14. A cable 16 that supplies a current from the gradient magnetic field power supply 5 to the gradient coil 2 is connected to the electrode unit 15. It is generally known that, when an electrode unit of a gradient coil is arranged in vacuum and a large current is supplied to the gradient coil, a discharge may occur at the electrode unit. To prevent such a discharge, for example, the electrode unit is covered with an insulator, such as a silicone. Thus, when the connection state of the electrode unit is checked, it is necessary to check after removing the insulator. In the present embodiment, however, the electrode unit 15 is exposed to the outside of the sealed space, which prevents any discharge that occurs at the electrode unit 15. Thus, because it is unnecessary to cover the electrode unit 15 with an insulator, the connection state of the electrode unit 15 can be checked easily. Accordingly, man-hour of maintenance works for the electrode unit 15 can be reduced.

As depicted in FIG. 3A, a bore tube supporter 17 is provided of which one end is fixed to the static magnetic field magnet 1 and the other end supports the bore tube 10 via an anti-vibration member 18. The anti-vibration member 18 is a member formed from an elastic member, such as rubber.

The bore tube supporter 17 prevents the first sealing member 11 from being squashed by the weight of the bore tube (including the weight of the patient). In order to reduce the vibrations transmitted from the gradient coil 2 to the static magnetic field magnet 1 and the bore tube 10, it is desirable that soft members are used as the first sealing member 11 and the second sealing member. In the present embodiment, because the bore tube 10 is supported by the bore tube supporter 17, a softer sealing member can be used and transmission of vibrations from the gradient coil 2 can be more reliably prevented. Because the bore tube 10 is supported via the anti-vibration member 18, the vibrations transmitted from the gradient coil 2 to the static magnetic field magnet 1 can be prevented from being transmitted via the bore tube supporter 17.

Here, a case is described where both side ends of each of the static magnetic field magnet 1 and the gradient coil 2 have the structure depicted in FIG. 3A. Alternatively, for example, only one of the ends may have the structure in FIG. 3A. In this case, the other end has a structure in which, for example, like a conventional MRI apparatus, a sealing cover is fixed to each of the side ends of the static magnetic field magnet 1 and the bore tube 10.

FIG. 3A depicts an example in which the first sealing member 11 and the second sealing member 12 are provided such that the whole side end of the gradient coil 2 is positioned outside the sealed space. However, for example, as depicted in FIG. 3B, a first sealing member 111 or a second sealing member 112 may be provided such that a part of the side end of the gradient coil 2 is positioned outside the sealed space.

Figure 4:
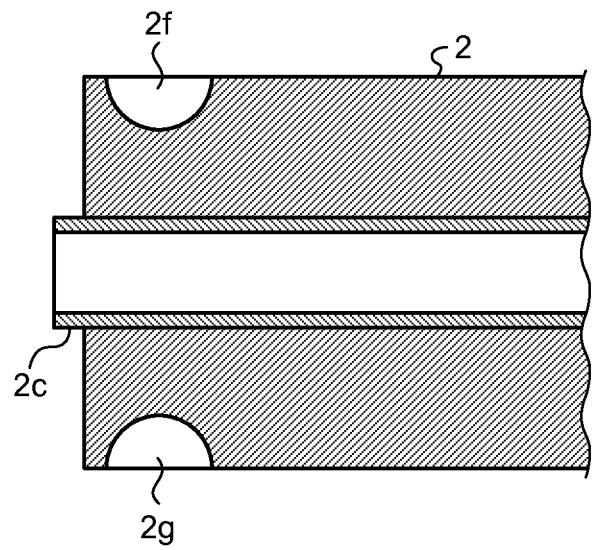
FIG. 4 is a cross-sectional view of the shape of the gradient coil in the vicinity of its side end according to the first embodiment.

The shape of the gradient coil 2 in the vicinity of the side end will be described here. FIG. 4 is a cross-sectional view of the shape of the gradient coil 2 in the vicinity of its side end according to the first embodiment. For example, in the gradient coil 2, as depicted in FIG. 4, a groove 2f is formed in a position where the first sealing member 11 makes contact and a groove 2g is formed in a position where the second sealing member 12 makes contact. Accordingly, the end of the first sealing member 11 on the side of the gradient coil 2 fits the groove 2f and the end of the second sealing member 12 on the side of the gradient coil 2 fits the groove 2g. Thus, for example, even if the air in the sealed space 13 is vacuumed by a vacuum pump to make the sealed space 13 a vacuum, the first sealing member 11 is prevented from being drawn toward the center of the sealed space 13 due to the lowering of the pressure in the sealed space 13. Similarly, the second sealing member 12 is prevented from being drawn toward the center of the sealed space 14 due to the lowering of the pressure in the sealed space 14.

Figure 5:
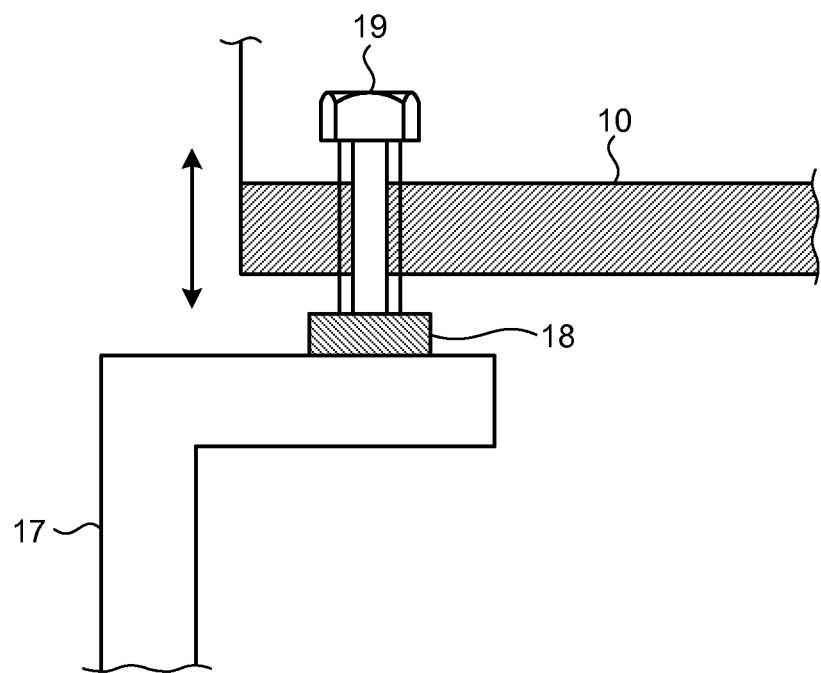
FIG. 5 is a diagram of a structure of a bore tube in the vicinity of its side end and an end of a bore tube supporter on the side of the bore tube according to the first embodiment.

The structure of the bore tube 10 in the vicinity of its side end and an end of the bore tube supporter 17 on the side of the bore tube 10 will be described here. FIG. 5 is a diagram of the structure of the bore tube 10 in the vicinity of its side end and the end of the bore tube supporter 17 on the side of the bore tube 10 according to the first embodiment. A gap adjuster that adjusts the gap between the end of the bore tube supporter 17 on the side of the bore tube 10 and the bore tube 10 is provided in the vicinity of the side end of the bore tube 10.

For example, as depicted in FIG. 5, a bolt 19 is attached in the vicinity of the side end of the bore tube 10. The bolt 19 is screwed into a through hole that is formed in the vicinity of the side end of the bore tube 10 and the tip of the bolt 19 makes contact with the anti-vibration member 18 set at the end of the bore tube supporter 17. By rotating the bolt 19, the bore tube 10 is shifted vertically. Accordingly, the position of the bore tube 10 can be adjusted easily such that the center axis of the bore tube 10 passes through the center of the magnetic field.

As described above, in the first embodiment, the magnetic resonance imaging apparatus 100 includes a sealed space forming unit that forms a sealed space that encloses the gradient coil 2 between the inner circumferential side of the static magnetic field magnet 1 and the outer circumferential side of the bore tube 10. At least a part of at least one of the side ends of the gradient coil 2 does not make contact with the sealed space formed by the sealed space forming unit. In other words, according to the first embodiment, the outer circumference and inner circumference of the gradient coil 2 are arranged in the sealed space and maintenance of the electrode unit 15 and the shim trays 2d provided on the side end of the gradient coil 2 can be performed easily. Thus, according to the first embodiment, it is possible to increase the maintainability of the gradient coil 2 while still preventing noise due to the vibration of the gradient coil 2.

According to the first embodiment, the gradient coil 2 can be sealed by using the outer circumference of the bore tube 10 and the inner circumference of the static magnetic field magnet 1. Accordingly, compared to the case where a sealed housing for sealing the gradient coil 2 is provided, the inner diameter of the bore tube 10 can be increased, which widens the space in which the patient is set.

According to the present embodiment, because sealed spaces can be formed without attaching any sealing cover at the end sides of the static magnetic field magnet 1 and the bore tube 10, the gradient coil 2 can be sealed regardless of the shape of the static magnetic field magnet 1.

When the whole gradient coil 2 is arranged in a sealed housing, the axial length of the sealed housing is long. For this reason, widening the opening of the bore from which a patient is inserted further increases the axial length of the bore, so that the MRI apparatus 100 becomes larger. In contrast, in the present embodiment, the side ends of the gradient coil 2 are arranged outside the sealed space, which shortens the axial length of the bore and, even when the opening of the bore is widened, the more compact MRI apparatus 100 can be made.

(Second Embodiment)

Figure 6:
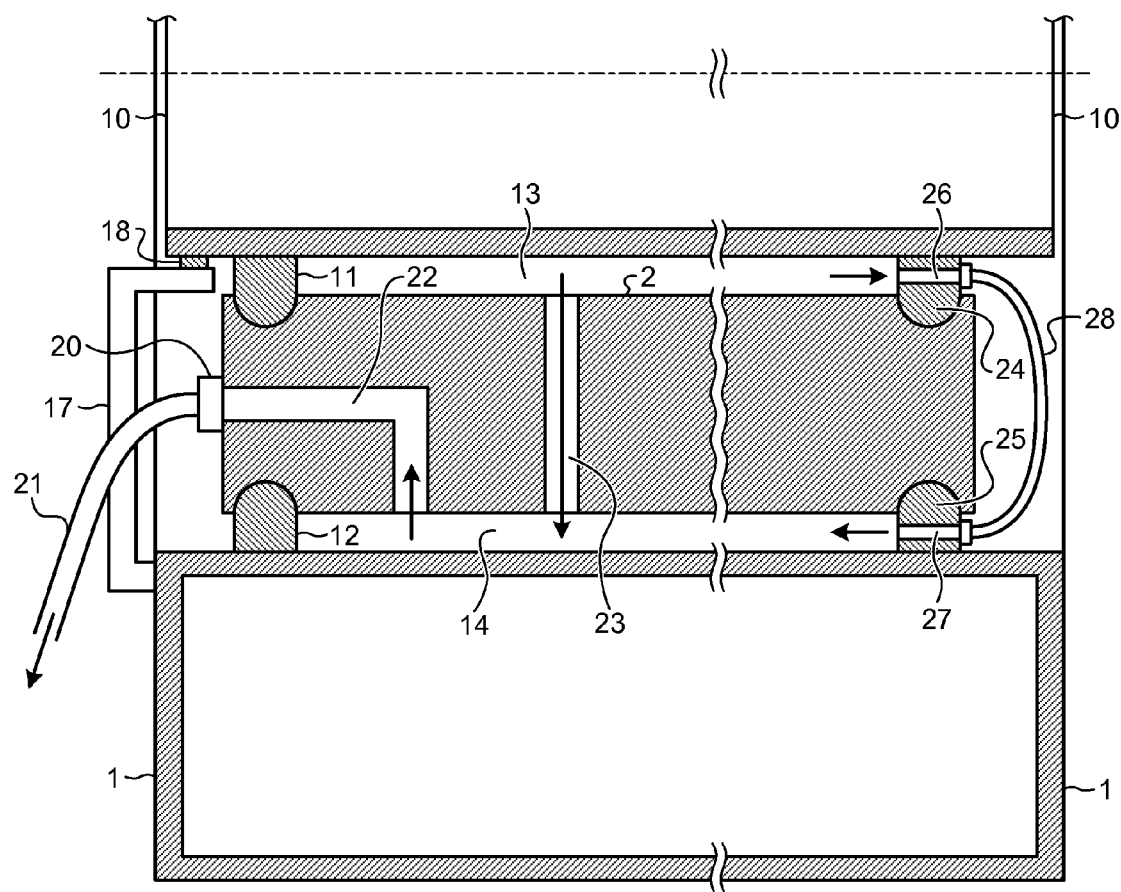
FIG. 6 is a cross-sectional view of a structure of a static magnetic field magnet and a gradient coil in the vicinity of their side ends according to a second embodiment.

A second embodiment will be described here. In the second embodiment, an outlet for discharging the air in the sealed space is provided at a side end of the gradient coil 2 represented in the first embodiment. FIG. 6 is a cross-sectional view of the structure of the static magnetic field magnet 1 and the gradient coil 2 in the vicinity of their side ends according to the second embodiment. FIG. 6 depicts a cross section of a part lower than the static magnetic field center, a cross section of the gradient coil 2 in a position where no shim tray insertion guide 2c is located, and an outer frame of the static magnetic field magnet 1. In the present embodiment, the elements that are the same as those already shown in the drawings are denoted by the same symbols and thus detailed descriptions thereof will be omitted.

For example, as depicted in FIG. 6, in a position where no shim tray insertion guide 2c is located in the gradient coil 2, an outlet 20 for discharging air in the sealed space 13 is provided at the side end that is positioned outside the sealed spaces 13 and 14. A hose 21 leading to a vacuum pump (not shown) is connected to the outlet 20. In addition, a flow channel 22 leading from the outlet 20 to the sealed space 14, which is formed on the outer circumferential side of the gradient coil 2, is formed in the coil of the gradient coil 2. Accordingly, by driving the vacuum pump, air in the sealed space 14 is discharged via the flow channel 22, the outlet 20, and hose 21, so that the sealed space 14 enters a vacuum state.

A case is described here where the flow channel 22 is formed that leads from the outlet 20 to the sealed space 14, which is formed on the outer circumferential side of the gradient coil 2. Alternatively, for example, a flow channel may be formed that leads to the sealed space 13, which is formed on the inner circumferential side of the gradient coil 2. Alternatively, a flow channel may be formed that bifurcates into two flow channels leading to the sealed spaces 13 and 14, respectively. Alternatively, multiple flow channels leading to the sealed space 13 and multiple flow channels leading to the sealed space 14 may be formed at different positions in the gradient coil 2.

Furthermore, the gradient coil 2 is provided with a flow channel allowing the air to flow between the sealed space 14, which is formed on the outer circumferential side of the gradient coil 2, and the sealed space 13, which is formed on the inner circumferential side of the gradient coil 2. For example, as depicted in FIG. 6, a through hole 23 is formed that penetrates from the inner circumferential side of the gradient coil 2 to the outer circumferential side of the gradient coil 2. Accordingly, it is possible to allow the air to flow freely between the sealed space 13 and the sealed space 14. Furthermore, for example, as depicted in FIG. 6, when a first sealing member 24 and a second sealing member 25 are arranged at the side end opposite to the side end provided with the outlet 20, a small through hole leading from the inside of the sealed space to the outside of the sealed space is formed in each sealing member. Furthermore, a thin tube 28 is provided that connects a through hole 26 formed in the first sealing member 24 and a through hole 27 formed in the second sealing member 25. Accordingly, it is possible to allow the air to flow freely between the sealed space 13 and the sealed space 14. As described above, by providing a flow channel that allows the air to flow between the sealed space 13 and the sealed space 14, all of the sealed spaces 13 and 14 can enter a vacuum state easily.

(Third Embodiment)

A third embodiment will be described here. As described above, the electrode unit 15 and the openings, such as the shim tray insertion guides 2c, are provided on the side end of the gradient coil 2. The smaller the area to be exposed to the atmosphere at the side end of the gradient coil 2, the lower the acoustic emissions from the gradient coil 2. For this reason, the positions of the sealing members may be changed depending on the position of the parts provided at the side end of the gradient coil 2.

In the third embodiment, an example will be described in which the position of the second sealing member 12 is changed depending on the position of the electrode unit. FIG. 7 is a cross-sectional view of the structure of the static magnetic field magnet 1 and the gradient coil 2 in the vicinity of their side ends according to the third embodiment. FIG. 7 depicts a cross section of a part lower than the static magnetic field center, a cross section of the gradient coil 2 at a position where the shim tray insertion guide 2c is located, and the outer frame of the static magnetic field magnet 1. Furthermore, FIG. 7 depicts only one of the side ends of each of the static magnetic field magnet 1 and the gradient coil 2, and the other side end has a structure that mirrors the structure depicted in FIG. 3A. The gradient coil 2 is, for example, supported by a support structure (not shown) provided on the inner circumference of the static magnetic field magnet 1 such that the gradient coil 2 is held at a given height at a position distant from the inner circumference of the static magnetic field magnet 1. In the third embodiment, the elements that are the same as those already shown in the drawings are denoted by the same symbols and thus detailed descriptions thereof will be omitted.

In the example shown in FIG. 7, no parts, such as an electrode, are provided on a side end surface of the gradient coil 2 on the outer circumferential side with respect to the shim tray insertion guide 2c. For example, as depicted in FIG. 7, a sealing member 30 is arranged on a side end surface of the gradient coil 2 on the outer circumferential side. In this case, for example, as depicted in FIG. 7, a fixed member 29 is provided that tucks the sealing member 30 between the fixed member 29 and the side end surface of the gradient coil 2. One end of the fixed member 29 is fixed to a side end surface of the static magnetic field magnet 1 via a sealing member 31. A groove to fix the position of the sealing member 30 such that the sealing member 30 is not vacuumed to the sealing space 14 is formed on the side end surface of the gradient coil 2 and the fixed member 29 in positions where the sealing member 30 makes contact.

As described above, for example, by arranging the sealing member 30 in an area where no parts are provided on the side end surface of the gradient coil 2, the area exposed to the atmosphere at the side end of the gradient coil 2 can be reduced. Accordingly, the acoustic emissions from the gradient coil 2 are reduced, which reduces noises due to vibrations of the gradient coil 2.

(Other Embodiments)

The first, second, and third embodiments are described above. However, embodiments of the technology disclosed by this application are not limited to them.

For example, in the above-described embodiment, a case is described where the MRI apparatus includes an ASGC as a gradient coil. However, the technology disclosed by this application can be similarly carried out even with an MRI apparatus that includes a gradient coil that includes no shield coil.

Furthermore, for example, in the above-described embodiment, a case is described where the MRI apparatus includes a gradient coil including shim trays. However, the technology disclosed by this application can be similarly carried out even with an MRI apparatus that includes a gradient coil that includes no shim tray.

Furthermore, for example, in the above-described embodiment, a case is described where the sealed space formed by the sealed space forming unit enters a vacuum state. However, the sealed space does not necessarily enter a vacuum state. Even if the sealed space is not a vacuum, it is possible to reduce noises generated by the gradient coil by arranging the gradient coil in the sealed space.

According to each of the above-described embodiments, it is possible to increase the maintainability of the gradient coil while preventing noises due to vibrations of the gradient coil.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a static magnetic field magnet formed to be approximately cylindrical and configured to generate a static magnetic field in a space in a cylinder;
a gradient coil formed to be approximately cylindrical, arranged in the cylinder of the static magnetic field magnet, and configured to add a gradient magnetic field to the static magnetic field;
a bore tube formed to be approximately cylindrical and arranged in a cylinder of the gradient coil; and
a sealed space forming unit configured to form a vacuum sealed space between an inner circumferential side of the static magnetic field magnet and an outer circumferential side of the bore tube, the sealed space enclosing the gradient coil except for at least a part of at least one of the side ends of the gradient coil which does not make contact with the vacuum sealed space.

2. The magnetic resonance imaging apparatus according to claim 1, wherein an opening to which a shim tray is inserted is formed at a side end of the gradient coil positioned outside the vacuum sealed space, the shim tray storing one or more iron shims configured to correct non-uniformity of the static magnetic field.

3. The magnetic resonance imaging apparatus according to claim 1, wherein an electrode unit to which a cable for supplying current to the gradient coil is provided at a side end of the gradient coil positioned outside the vacuum sealed space.

4. The magnetic resonance imaging apparatus according to claim 1, wherein the vacuum sealed space forming unit includes:
a first sealing member arranged in a gap between an outer circumference of the bore tube and an inner circumference of the gradient coil in the vicinity of the side end of the gradient coil and configured to seal the gap; and
a second sealing member arranged in a gap between an inner circumference of the static magnetic field magnet and an outer circumference of the gradient coil in the vicinity of the side end of the gradient coil and configured to seal the gap.

5. The magnetic resonance imaging apparatus according to claim 4, wherein grooves are formed in the gradient coil in positions where the first sealing member and the second sealing member make contact.

6. The magnetic resonance imaging apparatus according to claim 1, further comprising:
a bore tube supporter having one end fixed to the static magnetic field magnet and the other end supporting the bore tube via an anti-vibration member.

7. The magnetic resonance imaging apparatus according to claim 6, further comprising a gap adjuster configured to adjust the gap between the end of the bore tube supporter on the side of the bore tube and the bore tube.

8. The magnetic resonance imaging apparatus according to claim 1, wherein an outlet for discharging the air in the vacuum sealed space is provided at a side end of the gradient coil positioned outside the vacuum sealed space.

9. The magnetic resonance imaging apparatus according to claim 1, wherein the gradient coil is provided with a flow channel allowing air to flow between a sealed space formed on the outer circumferential side of the gradient coil and the vacuum sealed space formed on the inner circumferential side of the gradient coil.

* * * * *